(12) United States Patent
Bulsara et al.

(10) Patent No.: US 6,285,249 B1
(45) Date of Patent: Sep. 4, 2001

(54) CONTROLLED STOCHASTIC RESONANCE CIRCUIT

(75) Inventors: Adi R. Bulsara; Frank E. Gordon; Mario E. Inchiosa, all of San Diego, CA (US); Markus Loecher, Princeton Jct., NJ (US); Luca Gammaitoni, Perugia (IT); Peter Haenggi, Augsburg (DE); Kurt Arn Wiesenfeld, Decatur, GA (US); William Ditto, Woodstock, GA (US); Joseph Neff, Atlanta, GA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/489,341

(22) Filed: Jan. 21, 2000

(51) Int. Cl.[7] .................................................... H03B 1/00
(52) U.S. Cl. .......................................... 327/551; 327/379
(58) Field of Search ................................... 327/551, 552, 327/379, 156, 355, 361, 362; 702/191, 194; 704/226

(56) References Cited

U.S. PATENT DOCUMENTS

| | | | |
|---|---|---|---|
| 5,579,184 | * 11/1996 | Nakanishi et al. | 327/156 |
| 5,789,954 | * 8/1998 | Toppen et al. | 327/156 |
| 5,789,961 | * 8/1998 | Bulsara et al. | 327/355 |
| 6,020,782 | * 2/2000 | Albert et al. | 327/552 |
| 6,133,770 | * 10/2000 | Hasegawa | 327/156 |

* cited by examiner

*Primary Examiner*—Kenneth B. Wells
(74) *Attorney, Agent, or Firm*—Harvey Fendelman; Eric James Whitesell; Peter A. Lipovsky

(57) ABSTRACT

A controlled stochastic resonance circuit applies stochastic resonance to bias a nonlinear device with a control signal having a selected amplitude, frequency, and phase to enhance or suppress the response of the device to a periodic signal embedded in noise.

9 Claims, 2 Drawing Sheets

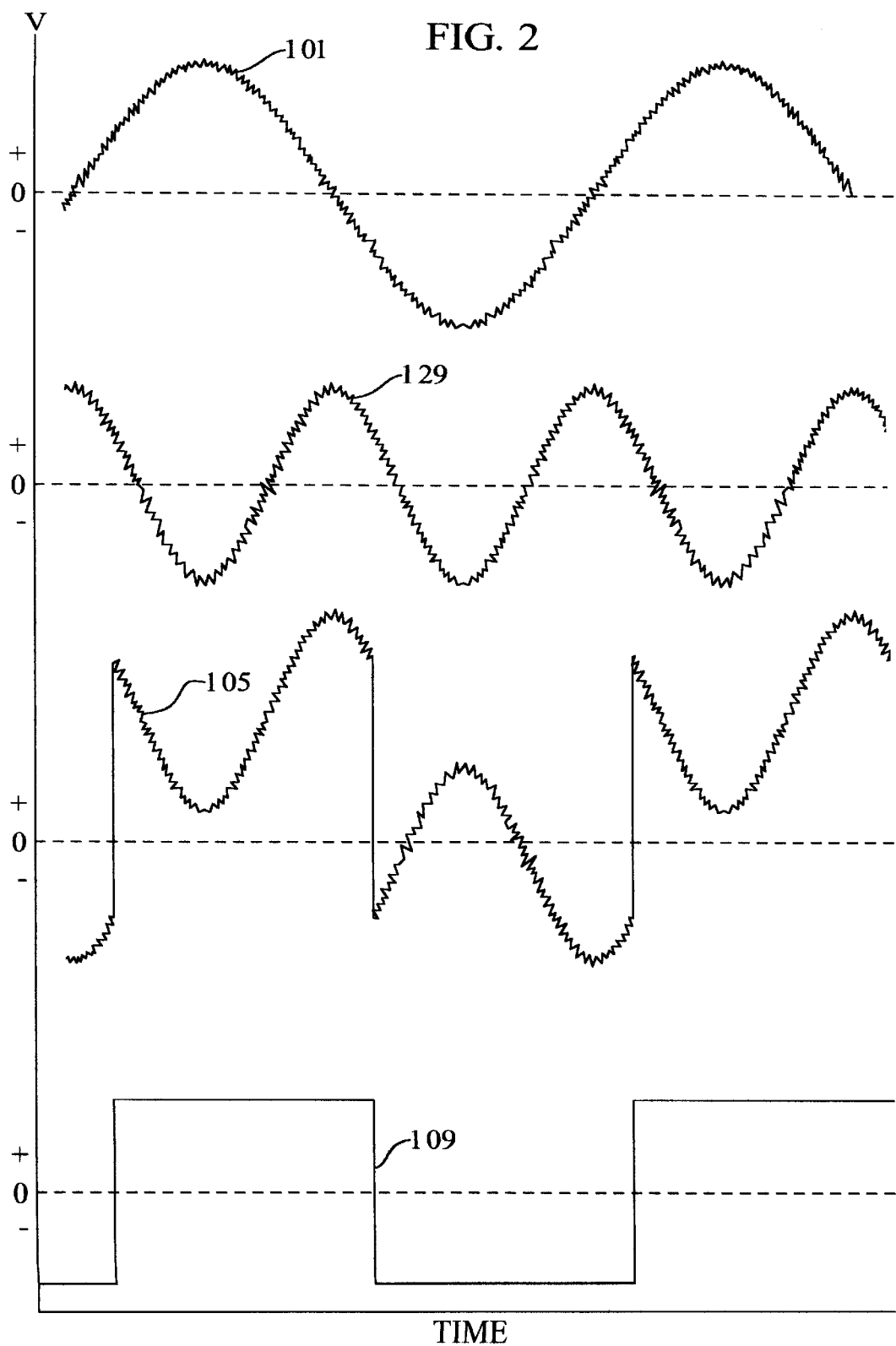

CONTROLLED STOCHASTIC RESONANCE CIRCUIT

BACKGROUND OF THE INVENTION

The present invention relates to the detection and suppression of periodic signals. More specifically, but without limitation thereto, the present invention relates to a circuit for applying stochastic resonance to bias a nonlinear device with a control signal having a selected amplitude, frequency, and phase to enhance or minimize the response of the device to a periodic signal.

The detection of periodic signals can, under certain conditions, be aided by the presence of controlled amounts of background noise in a nonlinear sensor. The mechanism for this type of signal detection is generally referred to as stochastic resonance. Signals are often encountered that are difficult to detect, even if the frequency is known.

In some cases, it may be desirable to remove certain frequencies from a power spectrum. Filtering is often used for this purpose, however filtering may result in complications, such as raising the noise floor in the output power spectral density. In some applications, such as vibration suppression, an active control scheme may be more effective or practical than filtering.

A continued need therefore exists for a way to enhance or remove periodic signals within a power spectrum.

SUMMARY OF THE INVENTION

The present invention is directed to overcoming the problems described above, and may provide further related advantages. No embodiment of the present invention described herein shall preclude other embodiments or advantages that may exist or become obvious to those skilled in the art.

A controlled stochastic resonance circuit of the present invention comprises a bistable electrical device having a voltage response to an input signal frequency that may be enhanced or suppressed by controlling the stochastic resonance of the circuit.

An advantage of the controlled stochastic resonance circuit of the present invention is that system response to an input signal may be enhanced or attenuated by adjusting the amplitude, frequency, and phase of a control signal.

Another advantage is that inherent or artificially introduced noise may be used to enhance or attenuate system response to an input signal.

The features and advantages summarized above in addition to other aspects of the present invention will become more apparent from the description, presented in conjunction with the following drawings.

DESCRIPTION OF THE DRAWINGS

FIG. 2 is a timing diagram of selected voltages in the circuit of FIG. 1.

DESCRIPTION OF THE INVENTION

Figure 1:
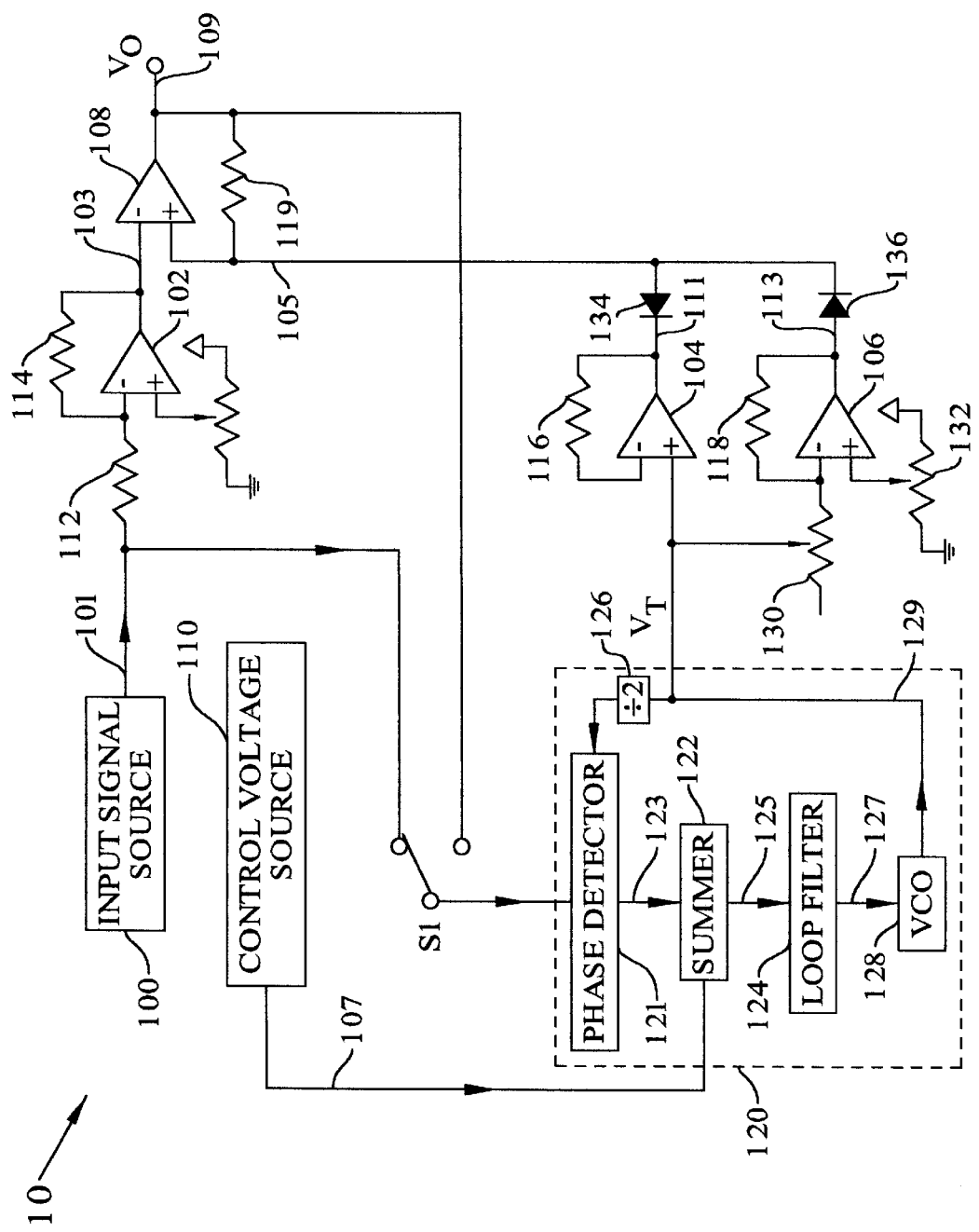
FIG. 1 is an electrical schematic of a controlled stochastic resonance circuit of the present invention.

The following description is presented solely for the purpose of disclosing how the present invention may be made and used. The scope of the invention is defined by the claims.

Stochastic resonance may be described as a statistical process in which a noisy nonlinear, multi-stable system is modulated by a weak signal that induces transitions among the stable states of the system. Input noise or inherent noise of a system that exhibits stochastic resonance causes the transitions among the stable states, but the transition probability is coherent with the weak signal.

A class of generic bistable dynamic systems may be described mathematically by the "particle in a potential" paradigm:

$$\frac{\partial x(t)}{\partial t} = -\frac{\partial U(x)}{\partial x} + A_r \sin(\omega_r t) + N(t) \qquad (1)$$

where $U(x)$ is a bistable potential function for the state variable $x(t)$, $N(t)$ is Gaussian noise, and $A_r \sin(\omega_r t)$ is an input signal. The power spectral density of $x(t)$ is known to exhibit spectral lines at odd harmonics of the signal frequency $\omega_r$. If the input signal has a low amplitude $A_r$ that makes detection difficult by conventional techniques, or if attenuation of the input signal is desired, then modulation of the system's internal parameters, for example, the potential barrier height separating the two stable states, may be desirable. In addition, the presence of noise $N(t)$ allows enhancement of the selected tone by adjusting either the noise intensity or the potential (i.e. system) parameters to exploit the effect of stochastic resonance.

An illustration of the above method for modulating the internal system parameters of a controlled stochastic resonance device is to apply a modulating signal $B \sin(\Omega t+\phi)$ such that the potential energy function becomes $U(x, B\sin(\Omega t+\phi))$, where $\phi$ is the phase angle between the input signal and the modulating signal. In this system, the height of the potential energy barrier separating the stable states of the system is modulated by the second argument of the potential function. As a result, the input signal is enhanced or suppressed, and a sequence of dips in background noise power may appear in the frequency power spectrum in the neighborhood of integer multiples of the control frequency $\Omega$.

Noise arising in the system and the environment or artificially introduced might actually be used to enhance the output signal-to-noise ratio, because there is a certain noise variance at which the amplitude of a given frequency in the output signal is maximized, i.e. stochastic resonance occurs. For a fixed noise variance, optimization of the output signal-to-noise ratio may be achieved by suitably adjusting the system if parameters, particularly the amplitude of modulating signal $B \sin(\Omega t+\phi)$. Even greater signal processing improvements may be realized by replacing a single nonlinear sensor by an array.

An input signal may be enhanced or attenuated for the cases where $\Omega=\omega_r$ and $\Omega=2\omega_r$ by appropriately adjusting the value of $\phi$. For the $\Omega=\omega_r$ case, the output signal-to-noise ratio at the frequency of the input signal $\omega_r$ has maxima (enhancement) at $\phi=\pi/2$ and $3\pi/2$, and minima (attenuation) at $\phi=0$ and $\pi$. An appropriate selection of the phase angle $\phi$ can therefore enhance or attenuate the output response at the frequency of the input signal $\omega_r$. The enhancement may be greater than that obtained in the absence of modulating signal $B \sin(\Omega t+\phi)$ in conventional stochastic resonance.

In the case where $\Omega=2\omega_r$, enhancement occurs at $\phi=\pi/2$ and attenuation at $\phi=3\pi/2$. In this case, the enhancement for a fixed noise level may significantly exceed the case where $\Omega=\omega_r$. In both cases, the degree of enhancement or attenuation may be controlled by adjusting the phase angle $\phi$ and the amplitude $B$ of the control signal.

The schematic of FIG. 1 illustrates an example of a controlled stochastic resonance circuit 10 of the present invention for enhancing or attenuating an input signal 101 from an input signal source 100. In this example, instead of a bistable potential function, the characteristic hysteresis between stable states of a Schmitt trigger is modulated by a sinusoidal signal having a selected phase angle with respect to the input signal. The phase angle is adjusted by a bias control voltage from voltage source 110.

Operational amplifiers 102, 104, 106,and 108 constitute a Schmitt trigger circuit. Op amp 102 inverts input signal 101 and outputs an inverted input signal 103 to op amp 108. Resistors 112 and 114 may have a resistance of, for example, 1K-Ohm. Op amp 108 is configured as a comparator that compares inverted input signal 103 with a threshold signal 105 to generate output signal 109.

Either output signal 109 or input signal 101 is selected by switch S1 and input to phase detector 121. Phase detector 121 compares the phase of the selected signal from S1 with a reference signal, VCO output 129, and generates a phase difference signal 123. A DC control voltage 107 generated by control voltage source 110 is added to phase difference signal 123 by a summer 122. A loop filter 124 filters control sum signal 125 from summer 122. Loop filter 124 may be, for example, a conventional lowpass filter for a phase locked loop. Loop filter output 124 outputs a frequency control voltage 127 that varies the frequency of voltage controlled oscillator 128. Voltage controlled oscillator 128 outputs a sinusoidal VCO output 129 having a frequency that is locked to the frequency of a periodic signal of interest in input signal 101 and a phase that is selected by switch S1 and varied by bias control voltage 107.

Alternatively, a frequency divider 126, such as a divide-by-two frequency divider, may be inserted between VCO 128 and phase detector 121 to further enhance the signal-to-noise ratio of output 109. For signal suppression, however, frequency divider 126 is optional.

Op amps 104 and 106 gate threshold voltage 111 and inverted threshold voltage 113 to comparator 108 in response to the polarity of VCO output 129 to modulate the non-inverting input of comparator 108. Op amp 104 inputs VCO output 129 and outputs a buffered non-inverted threshold voltage 111. Resistor 116 has a resistance of, for example, 1K Ohms.

Op amp 106 inputs VCO output 129 and outputs an inverted buffered threshold voltage 113. Resistor 118 has a resistance of, for example, 5K Ohms, and variable resistors 130 and 132 may have a resistance of 10K and 100K respectively for trimming the gain to unity and the offset to zero.

Diode 134 is gated off when output signal 109 is negative, and threshold voltage 113 is gated to input 105 of comparator op amp 108. When output signal 109 is positive, diode 136 is gated off, and threshold voltage 111 is gated to input 105. The gating action of diodes 134 and 136 modulates the height of the potential energy barrier, or hysteresis, of the Schmitt trigger circuit.

FIG. 2 is a timing diagram of voltages 101, 129, 105, and 109 in the circuit of FIG. 1. In this arrangement, the periodic signal embedded in noise as shown in input signal 101 is enhanced in output signal 109. For enhancing the periodic signal, S1 should be connected to Vo (output signal 109). Alternatively, when it is desirable to suppress the periodic signal in output signal 109, S1 should be connected to input signal 101. The degree of enhancement or attenuation of the periodic signal may be controlled by varying DC bias control voltage 107.

Other modifications, variations, and applications of the present invention may be made in accordance with the above teachings other than as specifically described to practice the invention within the scope of the following claims.

We claim:

1. A controlled stochastic resonance apparatus comprising:

a signal inverter for connecting to an input signal source wherein the input signal comprises a periodic signal embedded in noise;

a signal comparator coupled to the signal inverter for coupling to a modulating signal to generate an output signal wherein the periodic signal is enhanced or attenuated;

a phase detector coupled to a reference signal and to one of the input signal source and the signal comparator for generating a phase difference signal;

a signal summer coupled to the phase detector for coupling to a bias control signal source to generate a control sum signal;

a loop filter coupled to the signal summer for generating a frequency control signal;

a variable frequency oscillator coupled to the loop filter for generating the reference signal;

and a modulator coupled to the variable frequency oscillator for generating the modulating signal.

2. The controlled stochastic resonance apparatus of claim 1 further comprising the bias control signal source.

3. The controlled stochastic resonance apparatus of claim 2 wherein the bias control signal is adjusted to enhance the periodic signal.

4. The controlled stochastic resonance apparatus of claim 2 wherein the bias control signal is adjusted to attenuate the periodic signal.

5. The controlled stochastic resonance apparatus of claim 1 further comprising a frequency divider coupled to the variable frequency oscillator for dividing the reference signal.

6. A controlled stochastic resonance apparatus for providing an output signal that includes an enhancement or attenuation of a selected periodic signal found within a signal input into said apparatus comprising:

a bistable device having two stable states and a potential energy barrier separating the stable states for coupling to a source of the input signal and for generating the output signal;

a modulator coupled to the bistable device for generating a modulating signal to modulate the potential energy barrier height; and a phase adjuster coupled to the modulator for adjusting the phase relationship of the modulating signal with respect to the input signal, wherein the selected periodic signal is enhanced or attenuated in the output signal by modulating the potential energy barrier and by adjusting the phase relationship of the modulating signal with respect to the input signal.

7. The controlled stochastic resonance apparatus of claim 6 wherein the bistable device is a Schmitt trigger.

8. The controlled stochastic resonance apparatus of claim 7 wherein the modulator is a phase locked loop coupled to the Schmitt trigger.

9. The controlled stochastic resonance apparatus of claim 8 wherein the phase adjuster is a DC bias control voltage source coupled to the phase locked loop.

* * * * *